United States Patent [19]

Koziol et al.

[11] Patent Number: 5,286,461
[45] Date of Patent: Feb. 15, 1994

[54] METHOD AND APPARATUS FOR MELT LEVEL DETECTION IN CZOCHRALSKI CRYSTAL GROWTH SYSTEMS

[75] Inventors: Jurek K. Koziol; Jonathan A. Talbott, both of Nashua, N.H.

[73] Assignee: Ferrofluidics Corporation, N.H.

[21] Appl. No.: 762,755

[22] Filed: Sep. 20, 1991

[51] Int. Cl.$^5$ .............................................. C30B 15/28
[52] U.S. Cl. ................................... 422/249; 156/601; 156/616.4; 156/617.1
[58] Field of Search .................. 156/607, 616.4, 617.1, 156/618.1, 620.4; 422/249

[56] References Cited

U.S. PATENT DOCUMENTS

| | | | |
|---|---|---|---|
| 3,291,650 | 12/1966 | Pohmen et al. | 156/601 |
| 3,740,563 | 6/1973 | Reichard | 156/601 |
| 3,958,129 | 5/1976 | Chernent et al. | 156/601 |
| 4,508,970 | 4/1985 | Ackerman | 156/601 |
| 4,915,775 | 4/1990 | Katsuoka et al. | 156/601 |
| 4,926,357 | 5/1990 | Katsuoka et al. | 156/601 |
| 5,089,238 | 2/1992 | Araki et al. | 156/601 |

*Primary Examiner*—Olik Chaudhuri
*Assistant Examiner*—FeLisa Garrett
*Attorney, Agent, or Firm*—Cesari and McKenna

[57] ABSTRACT

The present invention is directed toward a melt level detection system for detecting the level of the melt surface in crystal growing systems that utilize a crucible containing a pool of melt from which a seed is withdrawn to grow the crystal. The detection system utilizes a light source for directing a light beam at the melt, and a light detection apparatus positioned on the other side of the melt for receiving the beam of light that is reflected off of the melt. The detection system utilizes a single element linear detector that provides output signals relating to whether the light beam is illuminating the detector, and where on the detector the illumination occurs. A computer system is utilized to implement an algorithm that processes the output signals from the detector which are continually sampled over time. The algorithm disregards the location data sent from the detector if it determines that the light beam was not incident on the detector for a given sample. By analyzing location data only for samples generated when the light beam was incident on the detector, the algorithm determines an average location of the melt level for a predetermined number of samples and assumes that this average is representative of the location of the actual melt level.

14 Claims, 5 Drawing Sheets

METHOD AND APPARATUS FOR MELT LEVEL DETECTION IN CZOCHRALSKI CRYSTAL GROWTH SYSTEMS

BACKGROUND OF THE INVENTION

1. Field of the Invention

This invention relates generally to crystal growing systems utilizing a melt within a crucible and a crystal seed that is withdrawn therefrom. More particularly, this invention relates to a method and apparatus for detecting the level of the melt within the crucible.

2. Background Discussion

Several techniques are known in the art for growing crystals. The Czochralski process is the most widely used of these processes and is generally summarized below. A heated crucible is provided for holding a melted form of a charge material from which the crystal is to be grown. The melt is maintained at a temperature slightly above that at which the charge material crystallizes, A seed is placed at the end of a cable or rod that enables the seed to be lowered into the melt material and then raised back out of the melt material. The seed can be either a sample of the desired crystal material, or any other compatible material that has a higher melting temperature and the same crystalline structure and parameters. When the seed is lowered into the melt material, it causes a local decrease in melt temperature, as is known to those skilled in the art, which results in a portion of the melt material crystallizing around and below the seed. Thereafter, the seed is slowly withdrawn from the melt. As the seed is withdrawn, the portion of the newly formed crystal that remains within the melt essentially acts as an extension of the seed and causes melt material to crystallize around and below it. This process continues as the crystal is withdrawn from the melt, resulting in crystal growth as the seed is continually raised.

A primary goal of crystal growing systems is to grow crystals that have uniform properties over their entire length. In order to achieve this goal, it is desirable to ensure that the growing conditions for the crystal remain constant throughout the growth process. A number of factors can influence the growing conditions of the crystal. In a system utilizing the Czochralski process, the crucible is located within a furnace that heats the crucible only around its exterior surface. During crystal growth, the melt level in the crucible changes. These changes of the melt level within the crucible result in changes in the thermogradients at the melt/crystal interface. Any change in the thermogradients during the growth of a crystal is undesirable because it changes the growing conditions for the crystal, thereby resulting in a non-uniform crystal. Two types of systems have been utilized that attempt to maintain uniform growing conditions in different ways. First, one type of system raises the crucible along with the crystal. These systems attempt to match the rate at which the crucible is raised to the rate at which the melt volume decreases so as to maintain the melt level at a constant vertical position relative to the furnace. In this manner, changes in the thermogradients due to decreased melt volume are reduced. Second, another type of system replenishes the melt as the crystal is withdrawn in an attempt to maintain a constant melt volume.

In each of the above-described systems, it is important to accurately determine the location of the melt level within the crucible so that either: (1) the crucible is raised by the appropriate amount; or (2) the amount of any decrease in melt volume can be detected in order to determine the appropriate amount of replenishing material to be added to the melt to restore it to its proper volume. Several prior art systems have been utilized for detecting the melt level. First, some systems have determined the melt level indirectly by determining the rate at which the crystal is withdrawn from the melt. These systems assume that the melt volume will decrease at a rate that is equal to the growth rate of the crystal. Therefore, they utilize the rate at which the seed is withdrawn from the melt order to estimate the growth rate of the crystal. However, this type of system allows only a crude and inexact determination of the melt level because it does not monitor the melt level directly. As previously stated, it is desirable to determine the melt level as precisely as possible in order to provide uniform growing conditions for the crystal.

Second, another type of prior art system utilized to detect the melt level is best described by making reference to FIGS. 1 and 3. A light source 1 is provided outside of the crucible and located to one side thereof. The light source provides a beam of light that is directed toward the melt. The beam of light reflects off of the melt and then upward toward a light detection system 3 that is located outside of the crucible and on the other side thereof. By analyzing the location of the reflected light beam, the light detection system 3 determines the position of the melt level.

For reasons that are more fully described below, the detection of the melt level in this second type of system is complicated by the fact that the melt surface is constantly interrupted by waves traveling across it. These waves are caused by a number of factors, some of which can be effectively minimized, and others that cannot. Some of the wave activity is due to mechanical movements that can be somewhat minimized through proper system design. For example, crystal growing systems generally rotate the crucible in order to ensure uniform heating of the melt. Furthermore, most systems either: (1) raise the crucible as the crystal is withdrawn from the melt material; or (2) add charge material to the crucible in order to replenish the melt as the crystal is withdrawn. Each of the above-described mechanical causes contributes to waves being formed across the surface of the melt.

Although some of the above-described mechanical effects can be minimized, there is another factor that contributes to the disruption of the melt surface that cannot be effectively minimized. In systems used to grow silicon crystals, an important consideration is preventing the introduction of contaminating material into the melt because it can lead to non-uniformities in the crystal, or change its properties thereby rendering it useless. There are a limited number of materials that are non-contaminating with respect to a melt of silicon material. Of these materials, the one that is generally used to line the interior of the crucible is $SiO_2$. Because this material is a chemical compound of silicon, the materials have an affinity for one another when they come into physical contact. As a result, waves are generated due to constant wetting and dewetting of the crucible. Although these processes are well-known to those skilled in the art, they are briefly summarized below.

Because the silicon melt material has such a strong affinity for the $SiO_2$ material along the interior of the crucible, it undergoes a constant wetting process where the silicon material attaches itself to the side of the crucible. During this process, the silicon material can even rise upward against the force of gravity and attach to the walls of the crucible. As a result, the melt level is briefly reduced. However, the surface forces responsible for this phenomenon are strongly influenced by the temperature and melt composition. Thin layers of melt are much more susceptible to temperature and composition changes. Such changes can perturb the balance of surface tension forces and cause a shift from wetting to a process of dewetting where the silicon that is attached to the sides of the crucible disengages from the sides of the crucible and reenters the melt. This perpetual wetting and dewetting causes fluctuations in the melt volume and causes waves to be formed across the surface of the melt. This effect cannot be practically prevented. Therefore, even if all the mechanical sources of waves are essentially eliminated, the melt surface will nevertheless be constantly interrupted due to waves formed due to the wetting and dewetting processes.

As previously stated, the fact that the melt surface is constantly interrupted by waves moving across it creates complications for melt detection systems utilizing a beam of light that is reflected off of the melt surface. The angle at which the light beam contacts the melt surface will vary depending upon what, if any, portion of a wave the beam contacts. Because waves are constantly moving across the melt surface, the angle at which the light beam contacts the melt surface will vary over time in a somewhat random manner. As the angle of contact between the light beam and the melt surface varies, the path of the light beam reflected off of the melt surface similarly varies, as shown in FIG. 1. Consequently, over a given time period, the reflected light beam moves about within a given area where its position can be detected as is shown in FIG. 2. The light pattern 5 represents the time elapsed position of the reflected light beam over a period of time and is essentially a random pattern that falls within an area 7. The light detection system must therefore be able to account for the fact that the light beam may be incident anywhere within the area 7 and that the area 7 may be rather large.

Prior art light detection systems have utilized detectors made from a number of discrete sensors as shown in FIG. 3. These prior art systems have utilized the discrete sensors in two basic configurations, i.e. as two-dimensional (2-D) area detectors such as the one shown in FIG. 3a, or as one-dimensional (1-D) array line detectors where a single line of sensors is utilized such as the one shown in FIG. 3b. The use of discrete sensors to form such detectors has a number of disadvantages. First, each sensor can be somewhat expensive. In this regard, the larger the area over which the reflected light beam may be incident, the more sensors that are necessary to cover that area, thereby increasing the cost of the detector system. Some prior art systems have utilized an optical lens positioned between the melt and the detector for the purpose of focusing the reflected light into a smaller area. However, even in such systems, a significant number of discrete sensors are required. Additionally, the use of an optical lens to reduce the detection area does not resolve any of the other disadvantages associated with the use of multiple discrete sensors that are described below.

Second, an array of small sensors is fragile in that each sensor is susceptible to becoming inoperative. In this regard, if any one of the sensors fails to operate properly, the sensor array necessarily functions improperly and cannot accurately detect the melt level. The larger the area over which the reflected light beam may be incident, the larger the sensor array must be and, correspondingly, the larger the number of sensors that must be utilized, thereby increasing the probability of a sensor becoming inoperative.

Third, the use of detectors made from discrete sensors creates some imprecision in the system, the degree of which is dependent upon the size of the individual elements which determine the resolution of the detector. Each sensor that is illuminated by the reflected light beam sends a notification signal to a control circuit. However, there is no way to determine precisely where, on such a sensor, the light beam is incident. Therefore, if large sensors are utilized, the melt level determination is imprecise because the precision with which the melt level can be detected is limited by the size of the sensors. As previously stated, it is desirable to determine the melt level as precisely as possible so as to minimize changes in the growing conditions, thereby enabling the growth of uniform crystals.

Accordingly, it is an object of the present invention to provide an improved method and apparatus for determining the melt level within a crucible utilized in a crystal growing system.

SUMMARY OF THE INVENTION

The present invention is directed toward a melt level detection system for detecting the level of the melt surface in crystal growing systems that utilize a crucible containing a pool of melt from which a seed is withdrawn to grow the crystal. The system utilizes a light source for directing a light beam at the melt, and a light sensing apparatus positioned on the other side of the melt for receiving the beam of light that is reflected off of the melt. The detection system utilizes a single linear detector sensor that provides output signals relating to whether the light beam is illuminating the detector, and where on the detector the illumination occurs. A computer system is utilized to implement an algorithm that processes the output signals from the detector which are continually sampled over time. The algorithm disregards the location data sent from the detector if it determines that the light beam was not incident on the detector for a given sample. By analyzing location data only for samples generated when the light beam was incident on the detector, the algorithm determines an average location of the melt level for a predetermined number of samples and assumes that this average is representative of the location of the actual melt level.

DETAILED DESCRIPTION OF THE INVENTION

Figure 1:
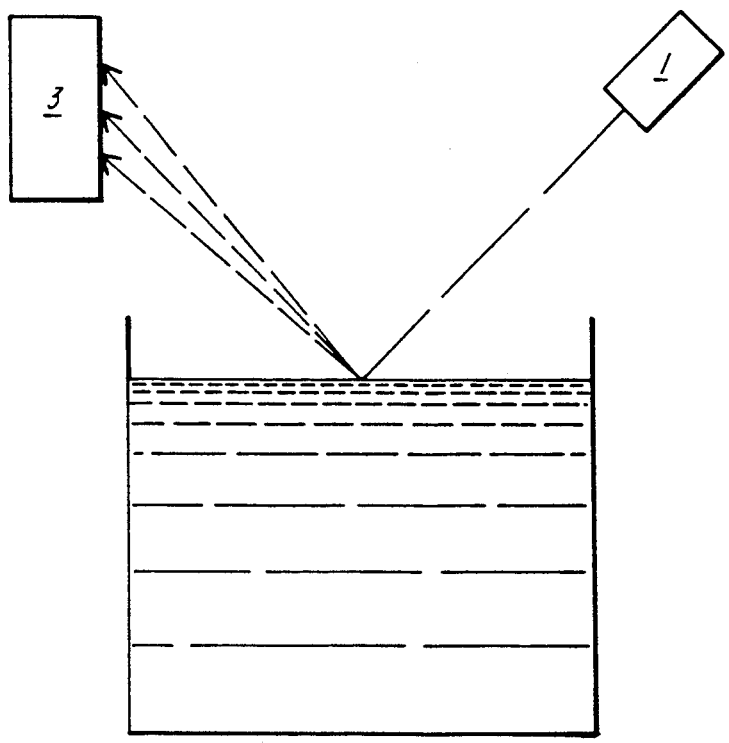
FIG. 1 shows a prior art system utilizing a reflected light beam for detecting the surface of the melt.
Figure 2:
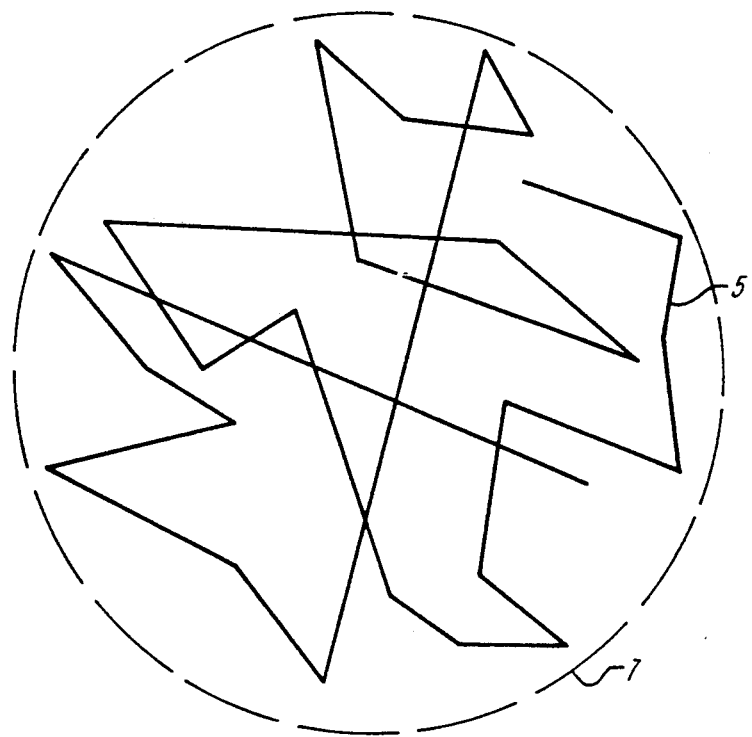
FIG. 2 shows the random movement of the reflected light beam across the detection area.
Figure 3A:
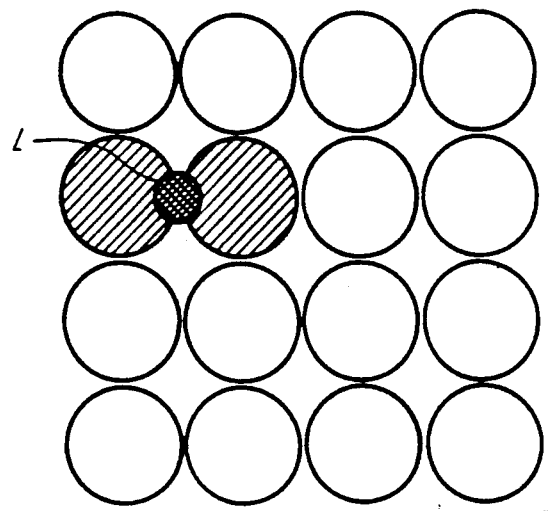
FIGS. 3a and b shows a prior art detection system utilizing multiple discrete sensors.
Figure 3B:
Figure 4:
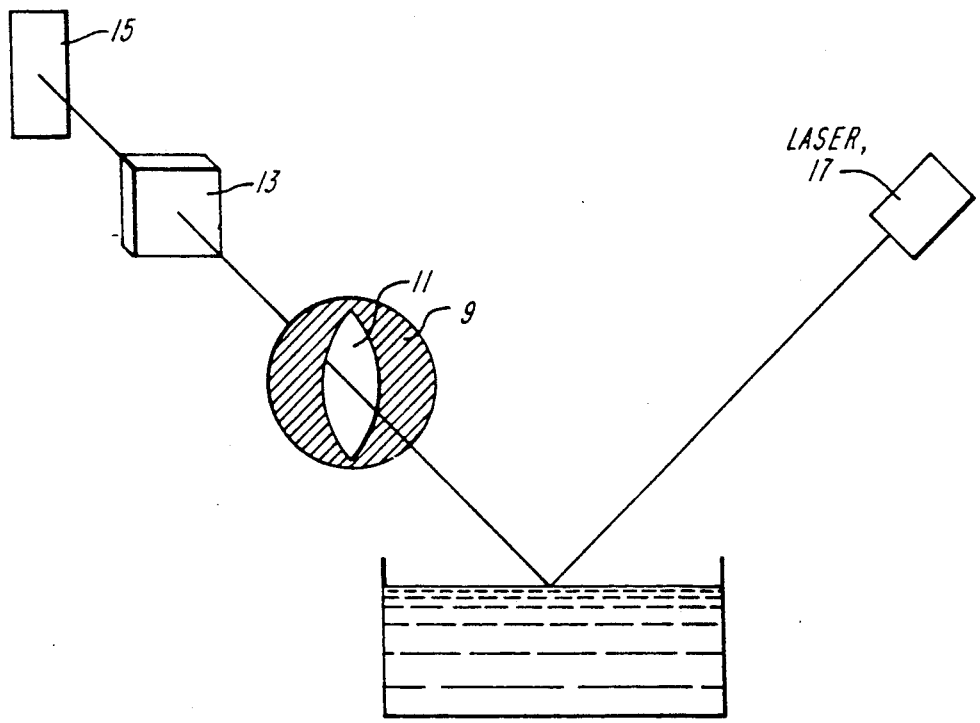
FIG. 4 provides an overview of the relationship between the various components of the present invention.

Reference is made to FIG. 4 for an explanation of the melt level detector of the present invention. The present invention utilizes a two-stage system for receiving the reflected light beam, comprising a light conditioning system, as well as a light detecting system. The conditioning system is comprised of a physical barrier 9 having an aperture 11, and a narrow band-pass filter 13. In crystal growing systems, the crucible is positioned within a furnace that is maintained at a very high temperature. Therefore, the interior of the furnace glows, thereby emitting rays of light. It is desirable to filter out these rays of light so that they do not reach the light detection system, thereby exposing the detection system to as little light as possible other than the reflected light beam.

In the preferred embodiment of the invention, a low power solid state GaAs laser is utilized as the light source. This laser has a power of 3-5 mW and transmits a light signal having a wavelength of 780 nm. The laser provides a light source that is well-suited to the present application because, as is known to those skilled in the art, the laser light maintains temporal and spatial coherency, i.e. the waves travel in only one direction and represent a single constant wavelength as they propagate.

The narrow band-pass filter 13 is matched to the wavelength of the laser light. Therefore, the filter absorbs light of other wavelengths but allows the reflected laser beam to pass therethrough. However, the filter is capable of only absorbing a certain amount of light before its performance degrades. Therefore, it is desirable to minimize the light, other than the reflected laser beam, that passes through to the filter. For this reason, the physical barrier 9 is positioned between the furnace and the filter. The device is provided with an aperture 11 through which the reflected laser beam passes. In addition, some light from the melt glow also passes through the aperture. However, the amount of light that can pass through the aperture is not sufficient to saturate the filter. Therefore, the light, other than the reflected laser beam, that passes through the aperture is absorbed by the filter and does not reach the light detector 15.

Figure 5:
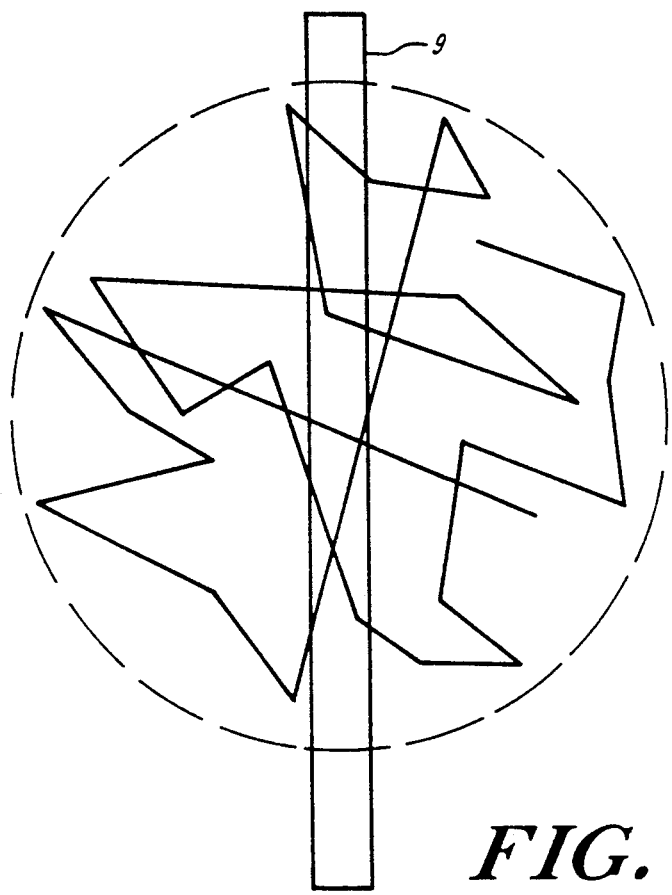
FIG. 5 shows the placement of the linear sensor utilized by the present invention.

Reference is now made to FIG. 5 for a description of the light detection system. The present invention utilizes a single-sensor linear detector 9 for detecting the position of the reflected light beam. The linear detector is positioned within the area across which it is expected that the reflected light beam will be incident. The detector is positioned vertically within this area because the light beam is expected to travel vertically as the melt level rises and falls. For example, if the melt level maintained a perfectly smooth surface such that the beam would be reflected as if off of a mirror, the light beam would travel up and down along a fixed vertical axis as the melt level rose and fell.

As shown in FIG. 5, the light detector 9 is not wide enough to cover the entire area across which the reflected light beam is expected to be incident. Therefore, there are times when the detector cannot provide any information with respect to the location of the reflected light beam because the reflected light beam does not fall onto the detector. In the preferred embodiment of the invention, the light detector 9 is a photodetector, i.e. a light sensitive device. An example of such a device is the single access position sensing photodetector, PIN-SL76, manufactured by United Detector Technology (UDT), a division of ILC Technology, Inc.

Figure 6:
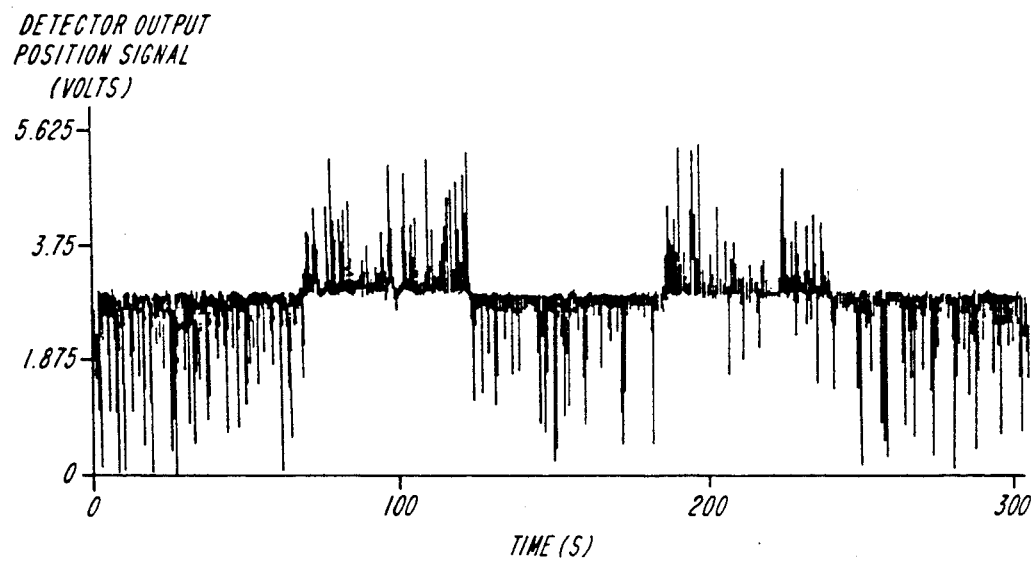
FIG. 6 shows time variations of the detector output position signal for five different melt levels.

The operation of the photodetector will now be described making reference to FIG. 6. The PIN-SL76 has two output signals, i.e. a strength signal and a position signal. The value of the position signal is indicative of the position of a light beam incident on the photodetector. FIG. 6 shows a graph of the position signal versus time as the melt level is varied over five different 60 second intervals. As the melt level varies, the position of the reflected light beam on the photodetector also necessarily varies. As shown in FIG. 6, when the reflected light beam illuminates the center of the photodetector, the position signal has a value of approximately 2 volts. As the reflected light beam moves closer to the upper portion of the photodetector, the value of the position signal correspondingly increases. Conversely, as the reflected light beam moves closer to the lower portion of the photodetector, the value of the position signal correspondingly decreases. Therefore, by analyzing the value of the position signal, the location of the light beam on the photodetector can be determined.

The present invention can be practiced using any of a number of standard computer hardware and software systems that are capable of implementing the algorithm described below. As previously stated with respect to FIG. 5, the detector utilized to practice the present invention does not fully cover the area across which the reflected light beam may be incident. Therefore, there are times at which the reflected light beam does not illuminate the detector because it is incident at a location on either side of the detector; at these times the position signal has a value that is equal to its value when the reflected light beam is incident on the center of the photodetector. Consequently, there are times at which the position signal does not provide valid information with respect to the location of the melt level because the detector is not illuminated by the reflected light beam.

Figure 7:
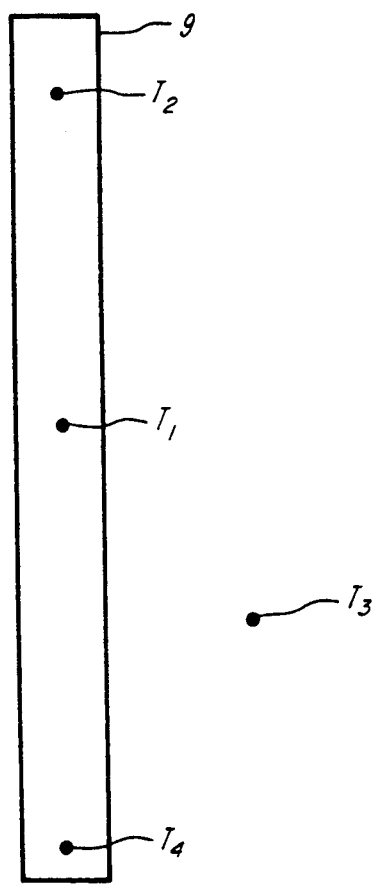
FIG. 7 shows multiple light beams illuminating the detection area of the present invention.

Reference is now made to FIG. 7 to further clarify the above-described situation. Dots T1-T4 represent the location of the reflected light beam at four different times. At time T3, the reflected light beam is at a location such that it does not illuminate the detector. Therefore, the detector does not provide any useful information regarding to the location of the melt level at this instance in time. At this time, the position signal will have a value equal to the value it has when the reflected light beam is located at the center of the detector. Therefore, the processing algorithm should distinguish this situation from that designated by time T1. Unlike the situation presented at time T3, the processing algorithm should realize that at time T1, the detector is providing valid information regarding the location of the melt level because the reflected light beam is illuminating the detector. In the preferred embodiment of the invention, the processing algorithm distinguishes the two situations described above by analyzing the strength of the light beam incident on the photodetector. If the reflected light beam illuminates the detector, the value of the strength signal output from the PIN-SL76 will exceed some threshold level. Therefore, by analyzing the strength signal, the processing algorithm can distinguish between the situation where the reflected beam is illuminating the detector, from the situation where the reflected light beam is not illuminating the detector. If the beam strength exceeds the threshold level, then the system recognizes that the light beam is illuminating the detector. However, if the strength signal does not exceed the threshold level, the system recognizes that the light beam is not illuminating the detector, and therefore the detector is not generating a valid signal relating to the location of the reflected light beam.

The data received from the detector can be analyzed in any of a number of ways to determine the location of the melt level. However, in the preferred embodiment of the invention, the location of the melt is determined by simply averaging the number of valid detector readings. In this regard, a valid detector reading is defined as one wherein the light strength is greater than the threshold level, thereby specifying that the light beam is illuminating the detector. The detector output is sampled at a rate that is dependent on the hardware used. In the preferred embodiment, the output from the detector is sampled at 40 Hz, i.e. 40 samples per second. A predefined number of valid samples is taken and then analyzed as a group. There are two competing factors to be considered when determining how many samples should be accumulated before the data is analyzed. It is desirable to detect any change in melt level as quickly as possible so that proper adjustments can be made quickly. This would suggest that only a small number samples should be taken before the data is analyzed. However, the number of samples taken should be large enough to provide a statistically meaningful sample so that the information received from the samples is accurate. In the preferred embodiment, 100 valid samples are accumulated before an average is determined. However, it will be understood that this number can be varied to other numbers that would also provide satisfactory results. Once the predefined number of valid samples have been accumulated, a simple average is generated for the signals received from the detector. A position along the photodetector is established for each valid sample, these are totaled and then divided by the number of samples to generate an average beam position representative of the specified number of samples. Thereafter, the system assumes that this position is an accurate representation for the melt level over the entire sample period.

Figure 8A:
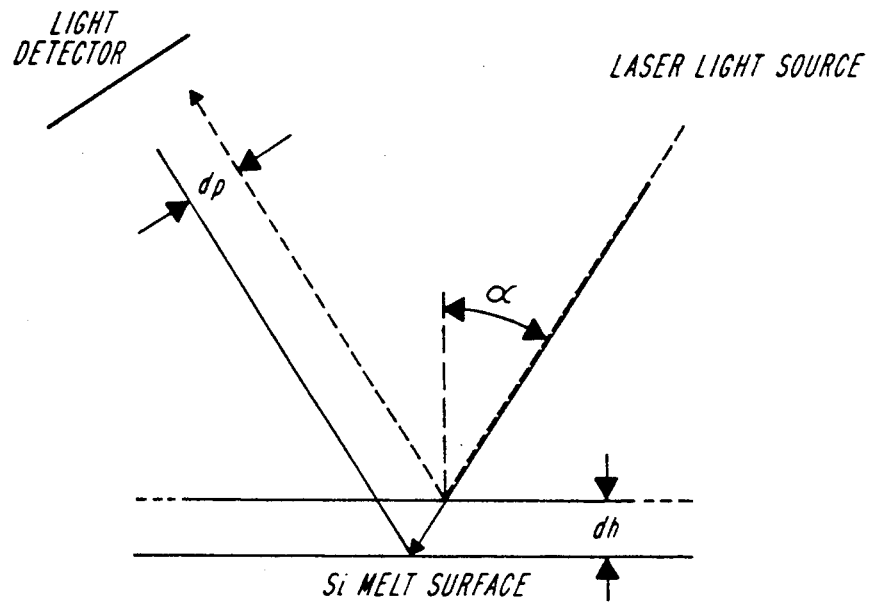
FIG. 8a shows the change in position of the reflected light beam on the light detector as the melt level changes.
Figure 8B:
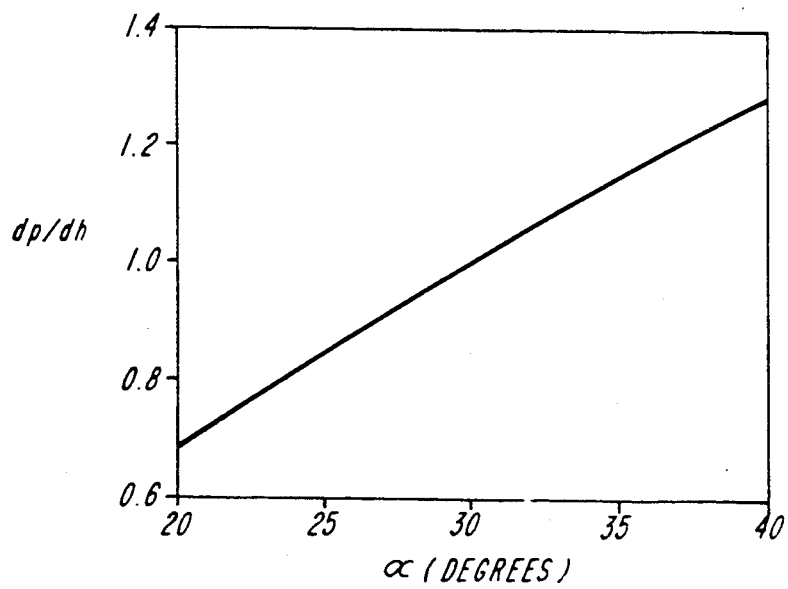
FIG. 8b shows the variation of the ratio between beam position change and melt position change as the laser beam incidence and reflection angles are varied.

As described above, an average is generated relating to position of the reflected light beam along the photodetector. Some additional processing must be done to correlate this position with the level of the melt within the crucible. This correlation is a simple geometrical relationship that is shown in FIGS. 8a and 8b. The change in melt level is specified by dh and the corresponding change in the location of the reflected light beam along the detector is specified by dp. In the preferred embodiment of the invention, the laser beam is positioned so as to contact the melt at an angle a that is nearly 30 degrees from the vertical. This angle was chosen because, as can be seen from FIG. 8b, it results in a 1:1 correspondence between the change in the vertical position of the melt level and the positional change of the reflected light beam on the photodetector. It should be understood that, alternatively, this correlation can be done for each sample prior to generating an average. Thereafter, an average can simply be determined for the melt level directly, rather than determining an average for the position along the photodetector prior to doing the correlation processing.

It should be understood that various changes and modifications of the embodiment shown in the drawings may be made within the scope of this invention. Thus, it is intended that all matter contained in the above description and shown in the accompanying drawings shall be interpreted in an illustrative and not limiting sense.

What we claim is:

1. An a crystal growing system for growing crystals of a material, the system including a crucible containing a pool of melt, the melt being a melted form of the material, the system further including a light source for directing a light beam at the melt, the light source being positioned outside of the crucible and located at a first side thereof, a melt level detection apparatus comprising:
   a detection apparatus including a linear sensing element having a length and an axis extending along its length, said sensing element being positioned outside of the crucible and located at a second side thereof such that it is capable of being illuminated by the light beam reflected off the melt, said sensing element further being positioned such that its axis lies in a vertical plane, said sensing element generating a location signal indicating a location of the reflected light beam along its length and a gating signal when the reflected light beam impinges on any portion of the sensor;
   processing means for utilizing the location signal to determine a level of the melt surface within the crucible; and
   gating means responsive to the gating signal for gating the location signal to the processing means.

2. A detection apparatus as claimed in claim 1 wherein said sensing element is a lateral-effect photodiode.

3. A detection apparatus as claimed in claim 1 wherein said sensing element is a photodetector.

4. A detection apparatus as claimed in claim 3 wherein said photodetector generates said location signal when the reflected light beam illuminates the photodetector at an illumination point,
   said location signal having a value that is dependent upon the location of the illumination point along the length of the photodetector,
   the processing means utilizing the location signal to determine a vertical location of the illumination point along the photodetector.

5. A detection apparatus as claimed in claim 4 wherein the light source is a laser, and wherein said photodetector generates a second signal having a value that is dependent upon the strength of light illuminating the photodetector and the sensing element includes comparison means responsive to the second signal for generating the gating signal when the processing means comprises storage means for storing a sample value of the location signal only when the second signal exceeds the threshold level, and averaging means for determining an average of the sample values; and
   wherein the detection apparatus further comprises:
   a physical barrier, said physical barrier being located between the melt surface and the detector, said barrier having an aperture for permitting passage of the reflected light beam through the barrier; and a filter located between the barrier and the detector, said filter passing light having a wavelength equal to a wavelength of the laser.

6. Detection apparatus for determining a melt level in a crystal growing system including a crucible containing a pool of melted material, the surface of which is in random, continual motion, and means for projecting a light beam at said melt surface so that said light beam reflects off said surface and arrives in a detection area, said light beam moving over said detection area in a random motion due to said motion of said surface; said level detection apparatus comprising;

light detection apparatus located in said detection area, said detection apparatus including a detector having a length, said detector being responsive to said light beam for generating a location signal indicating the position of said light beam along its length and for generating an amplitude signal indicating an intensity of said light beam;

means responsive to said location signal for processing said signal to determine said melt level; and means responsive to said amplitude signal for forwarding said location signal to said processing means.

7. Detection apparatus for determining a level of fluid material in a crystal growing system including a container containing a pool of fluid material, the surface of which is in random, continual motion, and means for projecting a light beam at the fluid surface so that the light beam reflects off the surface and the reflected light beam arrives in a detection area, the reflected light beam moving over the detection area in a random motion due to the motion of the surface; said level detection apparatus comprising:

light detection apparatus located in the detection area, said light detection apparatus having a surface and generating a location signal indicating the location of the reflected light beam on its surface and an amplitude signal indicating that the reflected light beam is incident on the surface;

means responsive to the location signal for processing the location signal to determine the level of the fluid material; and gating apparatus responsive to the amplitude signal for providing the location signal to said processing apparatus when the amplitude signal exceeds a predetermined amplitude.

8. A detection apparatus as claimed in claim 7 wherein the light detection apparatus comprises a photodetector having a length and being positioned such that its length extends in a vertical plane, the photodetector generating a first signal when the reflected light beam illuminates its surface at an illumination point, said first signal having a value that is dependent upon the location of the illumination point along the length of the photodetector;

the processing means utilizing said first signal to determine a vertical location of the illumination point along the photodetector.

9. A detection apparatus as claimed in claim 8 wherein the photodetector generates a second signal having a value that is dependent upon the strength of light illuminating its surface and independent of the location of the illumination point along its length, and wherein the gating means includes:

comparison means for determining whether the second signal exceeds a threshold level, and storage means for storing a sample value of the first signal only when the second signal exceeds the threshold level.

10. A detection apparatus as claimed in claim 9 wherein the processing means comprises:

averaging means for determining an average of stored sample values.

11. Detection apparatus for determining a level of fluid material in a crystal growing system including a container containing a pool of fluid material, the surface of which is in random, continual motion, and means for projecting a light beam at the fluid surface so that the light beam reflects off the surface and the reflected light beam arrives in a detection area, the reflected light beam moving over the detection area in a random motion due to the motion of the surface; said level detection apparatus comprising:

light detection apparatus located in the detection area, said light detection apparatus including a detector having a surface area that is smaller than the detection area, the detector generating a first signal indicating the location of the reflected light beam on its surface and a second signal indicating that the reflected light beam is impinging its surface; and means, responsive to the first signal and to the second signal, for processing the first signal to determine the level of the fluid material when the second signal indicates that the reflected light beam is impinging on any part of the surface of the light detection apparatus.

12. A detection apparatus as claimed in claim 11 wherein said detector has a length and generates a first signal when the reflected light beam illuminates its surface at an illumination point, said first signal indicating the location of the illumination point along the length of the detector;

the processing means utilizing said first signal to determine a vertical location of the illumination point along the detector.

13. A detection apparatus as claimed in claim 12 wherein the processing means comprises:

storage means for storing a sample value relating to the first signal only when the second signal indicates that the reflected light beam illuminates the surface of the detector.

14. A detection apparatus as claimed in claim 13 wherein the processing means comprises:

averaging means for determining an average of the sample values, and means responsive to the average for determining the level of the fluid material.

* * * * *